(12) United States Patent
Frazier

(10) Patent No.: US 6,456,215 B1
(45) Date of Patent: Sep. 24, 2002

(54) METHOD AND SYSTEM FOR QUANTIZING AN INPUT SIGNAL

(75) Inventor: Gary A. Frazier, Garland, TX (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/726,770

(22) Filed: Nov. 29, 2000

(51) Int. Cl.[7] ............................................. H03M 1/00
(52) U.S. Cl. ..................... 341/133; 327/77; 327/195; 341/118; 341/200
(58) Field of Search ............................. 341/155, 133, 341/200; 327/77, 195

(56) References Cited

U.S. PATENT DOCUMENTS

| | | | |
|---|---|---|---|
| 4,876,544 A | 10/1989 | Kuraishi | 341/166 |
| 5,073,777 A | 12/1991 | Fukuhara et al. | 341/131 |
| 5,283,583 A | 2/1994 | Ichihara | 341/162 |
| 5,363,101 A | 11/1994 | Ueki | 341/143 |
| 5,392,039 A | 2/1995 | Thurston | 341/143 |
| 5,528,239 A | 6/1996 | Swanson et al. | 341/143 |
| 5,550,872 A | 8/1996 | Liberti, Jr. et al. | 375/347 |
| 5,579,247 A | 11/1996 | Kerth et al. | 364/571.02 |
| 5,629,700 A | 5/1997 | Kumamoto et al. | 341/161 |
| 5,774,008 A * | 6/1998 | Shou et al. | |
| 5,835,044 A | 11/1998 | Nishino | 341/143 |
| 5,852,374 A * | 12/1998 | Frazier | |
| 5,854,374 A * | 12/1998 | Frazier | 327/195 |
| 5,898,395 A | 4/1999 | Werrbach et al. | 341/118 |
| 5,986,605 A | 11/1999 | Priebe et al. | 342/427 |
| 6,014,570 A | 1/2000 | Wong et al. | 455/500 |
| 6,087,986 A | 7/2000 | Shoki et al. | 342/383 |
| 6,094,173 A | 7/2000 | Nylander | 343/742 |
| 6,157,220 A * | 12/2000 | Broekaert | 327/195 |
| 6,166,690 A | 12/2000 | Lin et al. | 342/383 |
| 6,208,277 B1 * | 3/2001 | Hellums et al. | 341/133 |
| 6,275,540 B1 | 8/2001 | Barrett, Jr. et al. | 375/316 |

OTHER PUBLICATIONS

Seitzer et al., Electronic Analog–to–Digital Converters, pp. 84–85, 1983.
Frerking, Digital Signal Processing in Communication Systems, pp. 495–496, 1994.

* cited by examiner

Primary Examiner—Michael Tokar
Assistant Examiner—Linh Van Nguyen
(74) Attorney, Agent, or Firm—Baker Botts L.L.P.

(57) ABSTRACT

In one aspect of the invention, a system for quantizing an input signal having a time-varying voltage includes a voltage-to-current converter operable to convert the input signal to a proportional current. The system also includes a first negative differential resistance element coupled in series with the voltage-to-current converter. The first negative differential resistance element is operable to switch from a first state to a second state based on the proportional current. In addition, the system includes a reset circuit coupled in parallel with the first negative differential resistance element. The reset circuit includes a second negative differential resistance element, and the reset circuit is operable to reset the first negative differential resistance element to the first state based on a reset signal.

18 Claims, 3 Drawing Sheets

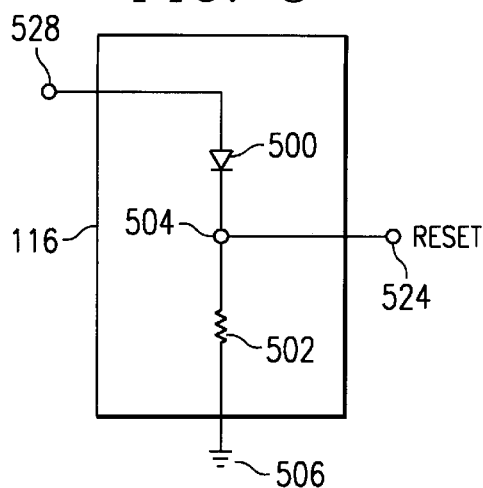
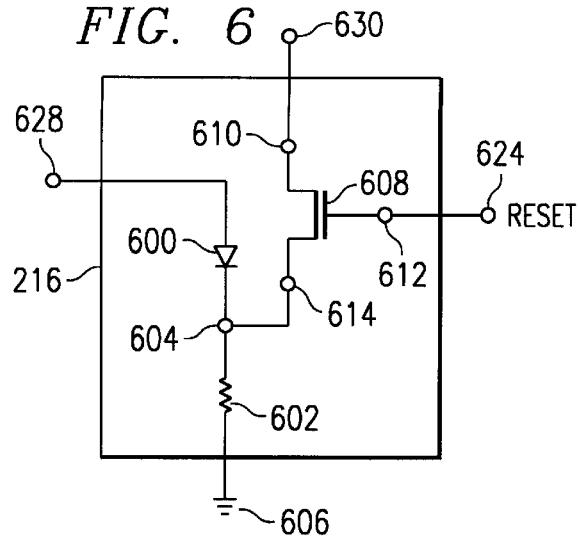
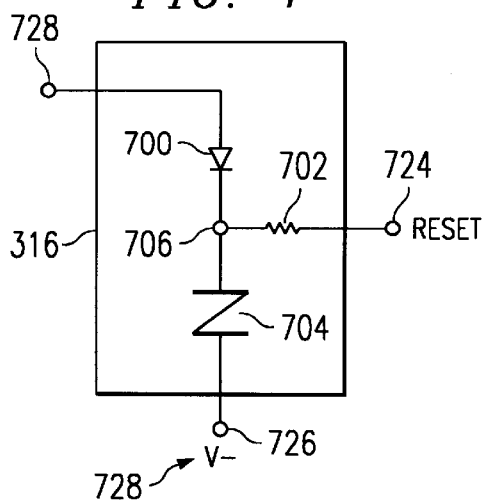
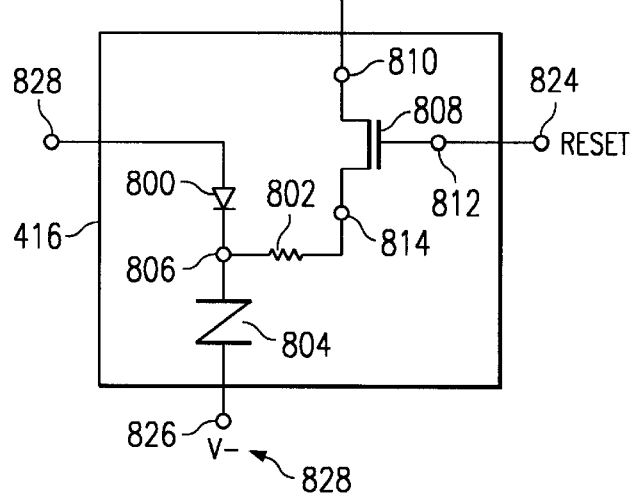
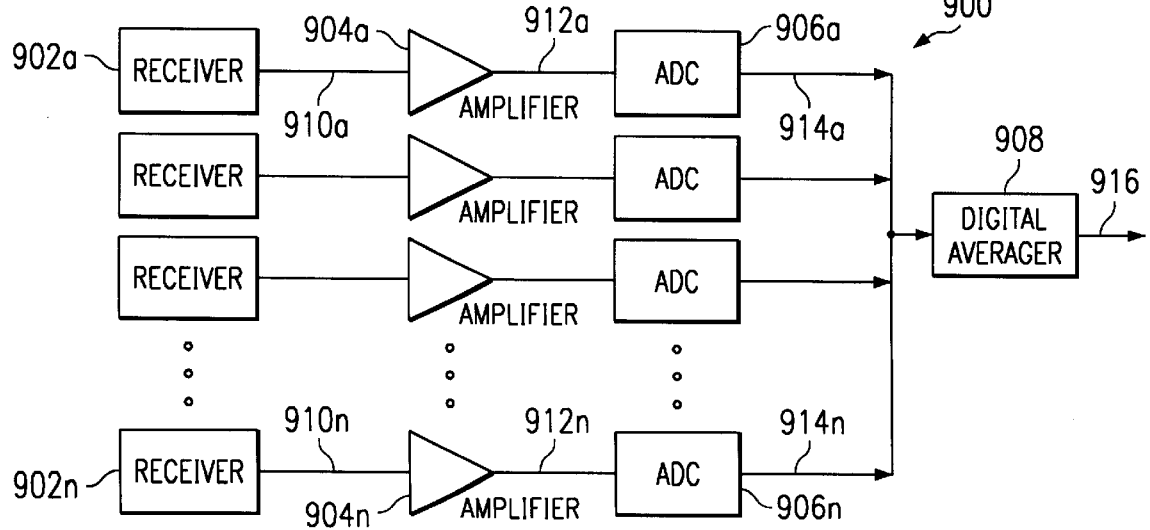

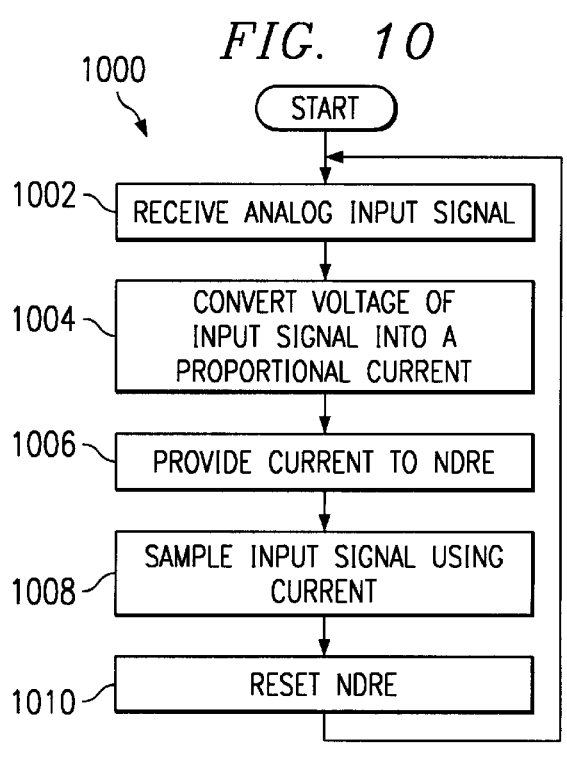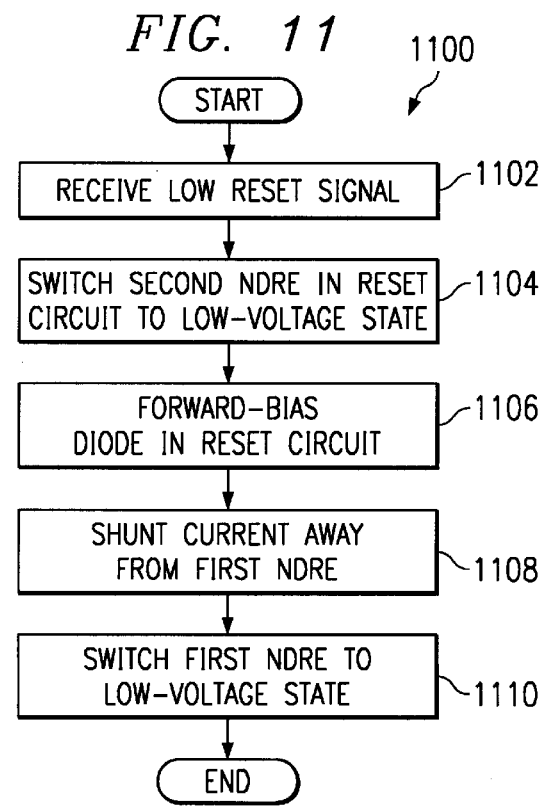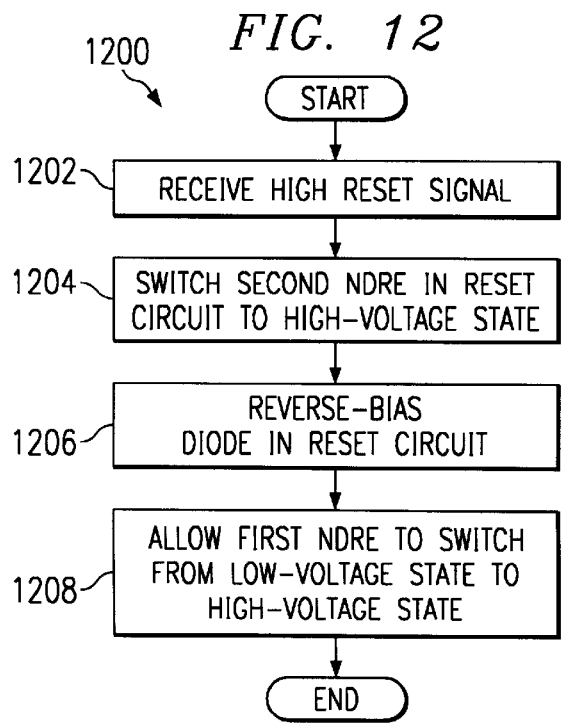

METHOD AND SYSTEM FOR QUANTIZING AN INPUT SIGNAL

TECHNICAL FIELD OF THE INVENTION

This invention relates generally to data processing, and more particularly to a method and system for quantizing an input signal.

BACKGROUND OF THE INVENTION

Communications systems often use analog-to-digital converters to sample analog input signals. The analog signals may contain information that will be processed by the communications system. Typically, the analog-to-digital converter receives the analog signal, samples the analog signal at different times, and generates digital representations of the analog signal at those times. A processor or other computing device in the communications system uses the digital representations of the analog signal to approximate the analog signal.

Many types and styles of analog-to-digital converters have been developed. Analog-to-digital converters often use a latch to quantize an analog input signal and generate a digital output signal. To quantize the analog input signal, the latch typically remains in a first state until the analog input signal exceeds a minimum threshold. While in the first state, the latch generates a low digital output signal. When the analog input signal exceeds the minimum threshold, the latch switches to a second state. In the second state, the latch generates a high digital output signal.

One type of analog-to-digital converter uses transistors to form the latch. A problem with this type of converter is that the operating speed of the converter is typically low. Signals in the converter typically must travel through the various transistors in the circuit. The path that the signals traverse is typically long. As a result, these longer distances slow the operating speed of the analog-to-digital converter. The analog-to-digital converter is unable to sample the analog input signal at higher sampling rates.

Another type of analog-to-digital converter uses a current sink and a tunneling diode as the quantizer. The tunneling diode typically operates in two states, one corresponding to a high digital output and one corresponding to a low digital output. In this type of quantizer, the tunneling diode is typically reset before each sample is taken of the analog input signal. This helps to ensure that the tunneling diode provides an accurate digital representation of the analog input signal during each sample of the analog signal. For example, the tunneling diode may be reset to generate a low digital output before each sample.

The tunneling diode is usually reset by a circuit that receives a reset signal. A problem with prior approaches is that prior analog-to-digital converters often use slow reset circuits. The slow speed of the reset circuit causes the tunneling diode to be reset at a slower speed. This slows the operating speed of the analog-to-digital converter and prevents the converter from sampling the analog input signal at higher sampling rates.

SUMMARY OF THE INVENTION

The present invention recognizes a need for an improved method and system for quantizing an input signal. The present invention reduces or eliminates at least some of the shortcomings of prior systems and methods.

In one embodiment of the invention, a system for quantizing an input signal having a time-varying voltage includes a voltage-to-current converter operable to convert the input signal to a proportional current. The system also includes a first negative differential resistance element coupled in series with the voltage-to-current converter. The first negative differential resistance element is operable to switch from a first state to a second state based on the proportional current. In addition, the system includes a reset circuit coupled in parallel with the first negative differential resistance element. The reset circuit includes a second negative differential resistance element, and the reset circuit is operable to reset the first negative differential resistance element to the first state based on a reset signal.

In another embodiment of the invention, a method for quantizing an input signal having a time-varying voltage includes converting the input signal to a proportional current, providing the proportional current to a first negative differential resistance element, and sampling the input signal based on the proportional current using the first negative differential resistance element. The first negative differential resistance element is operable to switch from a first state to a second state based on the proportional current. The method also includes resetting the first negative differential resistance element to the first state based on a reset signal using a reset circuit. The reset circuit includes a second negative differential resistance element coupled in parallel with the first negative differential resistance element.

In yet another embodiment of the invention, a system for quantizing an input signal having a time-varying voltage includes a voltage-to-current converter comprising a current source. The voltage-to-current converter is operable to convert the input signal to a proportional current. The system also includes a negative differential resistance element coupled in series with the voltage-to-current converter. The negative differential resistance element is operable to switch from a first state to a second state based on the proportional current. The system further includes a reset circuit coupled in parallel with the negative differential resistance element. The reset circuit is operable to reset the negative differential resistance element to the first state based on a reset signal.

Numerous technical advantages can be gained through various embodiments of the invention. Various embodiments of the invention may exhibit none, some, or all of the following advantages. For example, in one embodiment of the invention, a system is provided that quickly quantizes a time-varying input signal. In a particular embodiment, the system uses a tunneling diode, such as a Resonant Tunneling Diode (RTD), to quantize the input signal. The use of a tunneling diode increases the speed of the system. The input signal is not forced to travel through long distances in the system, which helps to increase the operating speed of the system.

Another advantage of some embodiments of the invention is that a faster reset circuit may be used within the system. In a particular embodiment, the reset circuit uses a second tunneling diode to reset the first tunneling diode. The use of a second tunneling diode to reset the first tunneling diode increases the speed of the reset circuit. Because the reset circuit operates at a higher rate, the system may also operate at a higher rate. This allows the system to sample the input signal at higher sampling rates.

In addition, some embodiments of the invention use a current source instead of a current sink. The current source may allow the system to sample the input signal at a faster rate. This also increases the operating speed of the system and allows the system to sample the input signal at higher sampling rates.

BRIEF DESCRIPTION OF THE DRAWINGS

For a more complete understanding of the present invention and the advantages thereof, reference is now made to the following descriptions taken in connection with the accompanying drawings, in which:

FIG. 5 is a block diagram illustrating an exemplary reset circuit constructed according to the teachings of the present invention;

FIG. 6 is a block diagram illustrating another exemplary reset circuit constructed according to the teachings of the present invention;

FIG. 7 is a block diagram illustrating yet another exemplary reset circuit constructed according to the teachings of the present invention;

FIG. 8 is a block diagram illustrating still another exemplary reset circuit constructed according to the teachings of the present invention;

FIG. 9 is a block diagram illustrating an exemplary communication system constructed according to the teachings of the present invention;

FIG. 10 is a flowchart illustrating an exemplary method for quantizing an input signal according to the teachings of the present invention;

FIG. 11 is a flowchart illustrating an exemplary method for resetting an analog-to-digital converter according to the teachings of the present invention; and FIG. 12 is a flowchart illustrating an exemplary method for sampling an input signal according to the teachings of the present invention.

DETAILED DESCRIPTION OF THE INVENTION

Figure 1:
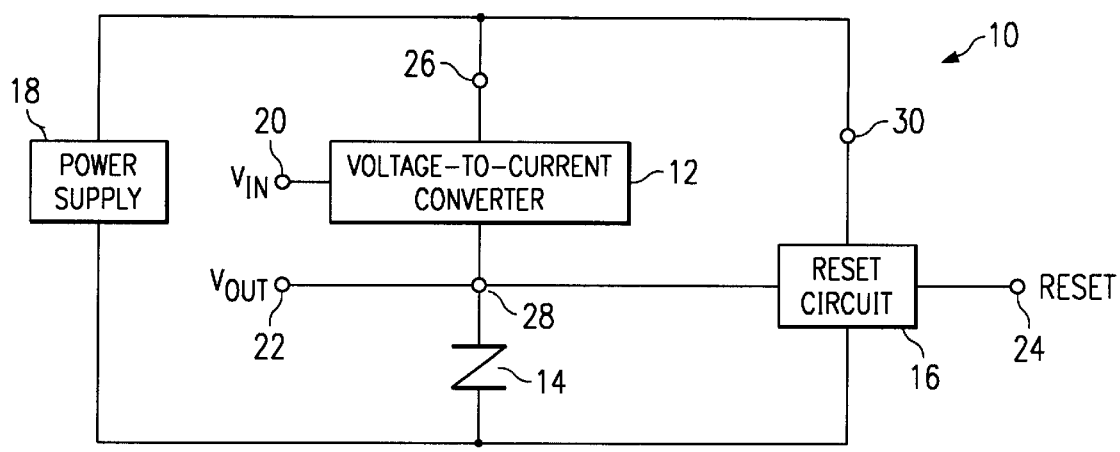
FIG. 1 is a block diagram illustrating an exemplary analog-to-digital converter constructed according to the teachings of the present invention.

FIG. 1 is a block diagram illustrating an exemplary analog-to-digital converter 10 constructed according to the teachings of the present invention. In the illustrated embodiment, analog-to-digital converter 10 includes a voltage-to-current converter 12, a resonant tunneling diode (RTD) 14, a reset circuit 16, and a power supply 18. Other embodiments of analog-to-digital converter 10 may be used without departing from the scope of the present invention.

In one aspect of operation, analog-to-digital converter 10 receives an input signal, such as an analog signal, at an input terminal 20. Analog-to-digital converter 10 quantizes the input signal, generating a digital output signal at an output terminal 22. To assist analog-to-digital converter 10 in generating digital values representing the input signal, analog-to-digital converter 10 includes resonant tunneling diode 14. Resonant tunneling diode 14 may switch between a first state and a second state depending on the voltage of the input signal at terminal 20. For example, when resonant tunneling diode 14 is in the first state, analog-to-digital converter 10 may generate a low digital output pulse at terminal 22. When resonant tunneling diode 14 is in the second state, analog-to-digital converter 10 may generate a high digital output pulse at terminal 22.

After sampling the input signal, resonant tunneling diode 14 typically needs to be reset to the first state before sampling the input signal again. Analog-to-digital converter 16 also includes reset circuit 16, which resets resonant tunneling diode 14 in response to a reset signal at an input terminal 24. The operating speed of analog-to-digital converter 10 may depend, at least in part, on the speed of the reset circuit 16. In one embodiment, reset circuit 16 includes a second resonant tunneling diode. The second resonant tunneling diode helps to increase the speed of the reset circuit 16, which also increases the speed of analog-to-digital converter 10.

Figure 3:
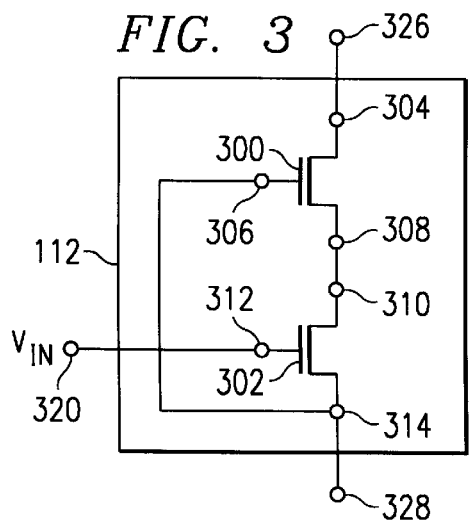
FIG. 3 is a block diagram illustrating an exemplary voltage-to-current converter constructed according to the teachings of the present invention.
Figure 4:
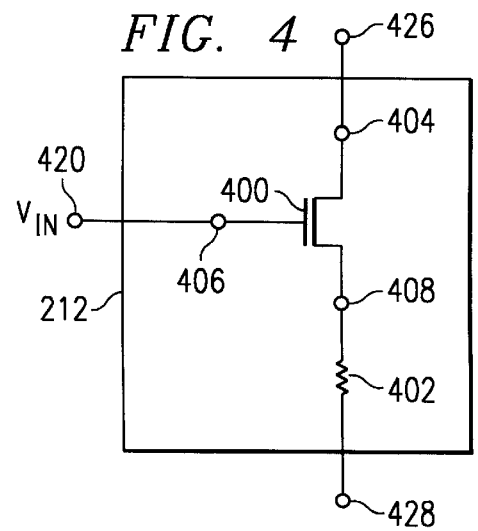
FIG. 4 is a block diagram illustrating another exemplary voltage-to-current converter constructed according to the teachings of the present invention.

Voltage-to-current converter 12 is coupled in parallel with power supply 18 and in series with resonant tunneling diode 14. In this document, the term "couple" refers to any direct or indirect communication between two or more elements, whether or not those elements are in physical contact with one another. Voltage-to-current converter 12 receives an input signal at terminal 20. Voltage-to-current converter 12 also receives power from power supply 18 at a terminal 26. Voltage-to-current converter 12 generates a current at a terminal 28 that is proportional to the voltage of the input signal at terminal 20. In one embodiment, when the voltage at terminal 20 is zero volts, voltage-to-current converter 12 may generate a particular amount of current. As the voltage at terminal 20 increases, the current produced by voltage-to-current converter 12 also increases. As the voltage at terminal 20 decreases, the current produced by voltage-to-current converter 12 also decreases. Example embodiments of various voltage-to-current converters are shown in FIGS. 3 and 4, which are described below. In one embodiment, voltage-to-current converter 12 comprises a current source.

Figure 2:
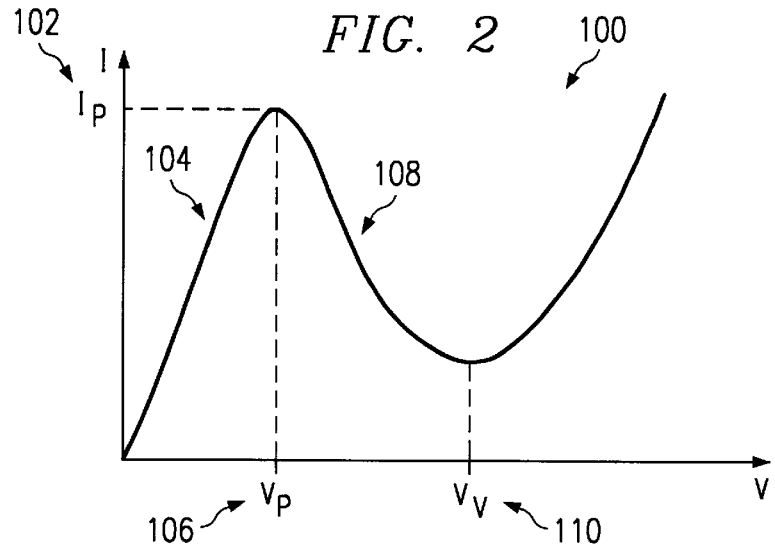
FIG. 2 is a diagram illustrating voltage and current characteristics of a resonant tunneling diode.

Resonant tunneling diode 14 is coupled in series with voltage-to-current converter 12. Resonant tunneling diode 14 is also coupled in parallel with reset circuit 16 and in parallel with power supply 18. Resonant tunneling diode 14 acts as a quantizing latch in analog-to-digital converter 10. Resonant tunneling diode 14 detects when the current generated by voltage-to-current converter 12 at terminal 28 exceeds a threshold amount. If the current at terminal 28 does not exceed a threshold amount, resonant tunneling diode 14 may operate in a low-voltage state. When operating in the low-voltage state, analog-to-digital converter 10 may generate a low digital output value at terminal 22. If the current at terminal 28 exceeds a threshold amount, resonant tunneling diode 14 "trips" and begins operating in a high-voltage state. When operating in the high-voltage state, analog-to-digital converter 10 generates a high digital output value at terminal 22. Typical voltage-current characteristics of one particular resonant tunneling diode are illustrated in FIG. 2, which is described below. Resonant tunneling diode 14 may comprise any suitable negative differential resistance element.

In one embodiment, when the voltage of the input signal at terminal 20 equals zero volts, voltage-to-current converter 12 generates a current that is less than the amount of current needed to trip resonant tunneling diode 14 from the low-voltage state to the high-voltage state. When the voltage at terminal 20 becomes positive, the current generated at terminal 28 by voltage-to-current converter 12 increases, tripping resonant tunneling diode 14 to its high-voltage state. However, when the voltage at terminal 20 becomes negative, the current generated at terminal 28 by voltage-to-current converter 12 decreases, and resonant tunneling diode 14 remains in the low-voltage state. This allows resonant tunneling diode 14 to act as a "zero crossing" detector, detecting when the voltage of the input signal changes between a positive and negative voltage. Other embodiments and configurations of analog-to-digital converter 10 may be used without departing from the scope of the present invention.

Reset circuit 16 is coupled in parallel with resonant tunneling diode 14. Reset circuit 16 resets resonant tunneling diode 14 to one of its states, such as its low-voltage state, in response to a reset signal at terminal 24. In one embodiment, when reset circuit 16 receives a reset pulse at terminal 24, reset circuit 16 creates a voltage bias of zero or near zero volts across resonant tunneling diode 14. This causes resonant tunneling diode 14 to return to its low-voltage state, regardless of the current at terminal 28. After the reset pulse, the voltage across resonant tunneling diode 14 may vary depending on the current at terminal 28, and another sample of the input signal may be taken. Example embodiments of various reset circuits are shown in FIGS. 5–8, which are described below. The reset signal received at terminal 24 may be generated by any suitable source. For example, the reset signal could be generated by a pulse generator, an optical pulse generator, or a pulsed power source.

Power supply 18 provides power to voltage-to-current converter 12 and/or reset circuit 16. Power supply 18 may comprise any suitable power supply, such as a direct current power supply. Although FIG. 1 illustrates analog-to-digital converter 10 as including one power supply 18, multiple power supplies 18 may be used without departing from the scope of the present invention. Also, in one embodiment, reset circuit 16 may operate without using power from power supply 18, and power supply 18 need not be coupled to reset circuit 16.

Although FIG. 1 illustrates one embodiment of analog-to-digital converter 10, other embodiments may be used without departing from the scope of the present invention. For example, although FIG. 1 illustrates analog-to-digital converter 10 as including resonant tunneling diode 14, analog-to-digital converter 10 may include any suitable negative differential resistance element. For example, in another embodiment, analog-to-digital converter 10 includes a tunneling diode. Also, to help isolate analog-to-digital converter 10 from other circuits in a system, a buffer may be placed behind resonant tunneling diode 14. The buffer may operate to isolate analog-to-digital converter 10 from other circuits without loading resonant tunneling diode 14. The buffer could, for example, comprise field effect transistors having a width of one micrometer. The buffer could also have less than a unity gain.

FIG. 2 is a diagram illustrating voltage and current characteristics 100 of resonant tunneling diode 14. When a current below a peak current ($I_p$) 102 is applied to terminal 28, resonant tunneling diode 14 is switched off in its low-voltage state 104, and the voltage drop across resonant tunneling diode 14 is less than a peak voltage 106. When the current at terminal 28 exceeds the peak current 102, resonant tunneling diode 14 is switched on in its high-voltage state 108, and the voltage drop across resonant tunneling diode 14 is between peak voltage 106 and a valley voltage 110. This property and other similar properties of negative differential resistance elements, such as resonant tunneling diode 14, allow switching back and forth between the low-voltage and high-voltage states. The different states of resonant tunneling diode 14 may be observed at output terminal 22 as different voltage levels. Multiple samples of the input signal typically produce changes in the voltage level at terminal 22, and those different voltages may form a digital output signal. As a result, resonant tunneling diode 14 may quantize the input signal received at input terminal 20 and generate a digital output signal at terminal 22.

In one embodiment, when the voltage of the input signal at terminal 20 is zero volts, voltage-to-current converter 12 generates a current at terminal 28 that is less than the peak current 102 of resonant tunneling diode 14. At this point, resonant tunneling diode 14 is operating in its low-voltage state 104, producing a low digital pulse in the digital output signal at terminal 22. When the voltage of the input signal at terminal 20 becomes positive, voltage-to-current converter 12 generates a current at terminal 28 that is greater than the peak current 102 of resonant tunneling diode 14. This trips resonant tunneling diode 14 into its high-voltage state 108, producing a high digital output pulse at terminal 22. However, when the voltage of the input signal at terminal 20 becomes negative, voltage-to-current converter 12 generates a current at terminal 28 that is less than the peak current 102 of resonant tunneling diode 14. This causes resonant tunneling diode 14 to remain in its low-voltage state 104, producing a low digital output pulse at terminal 22.

To reset resonant tunneling diode 14 after sampling the input signal, reset circuit 16 may force the voltage bias across resonant tunneling diode 14 below the peak voltage 106 of resonant tunneling diode 14, such as to zero or near zero volts. Reset circuit 16 may also shunt current away from resonant tunneling diode 14, dropping the current provided to resonant tunneling diode 14 below peak current 102. This forces resonant tunneling diode 14 back into its low-voltage state 104, resetting resonant tunneling diode 14 for the next sample of the input signal.

FIG. 3 is a block diagram illustrating an exemplary voltage-to-current converter 112 constructed according to the teachings of the present invention. Voltage-to-current converter 112 may be suitable for use in analog-to-digital converter 10 of FIG. 1. In the illustrated embodiment, voltage-to-current converter 112 includes a first field effect transistor 300 and a second field effect transistor 302. First field effect transistor 300 includes a source electrode 304, a gate electrode 306, and a drain electrode 308. Second field effect transistor 302 includes a source electrode 310, a gate electrode 312, and a drain electrode 314. Source electrode 304 of first field effect transistor 300 is coupled to power supply 18 through terminal 326. Gate electrode 306 of first field effect transistor 300 is coupled to the drain electrode 314 of second field effect transistor 302. Drain electrode 308 of first field effect transistor 300 is coupled to source electrode 310 of second field effect transistor 302. Gate electrode 312 of second field effect transistor 302 is coupled to input terminal 320. Drain electrode 314 of second field effect transistor 302 is coupled to gate electrode 306 of first field effect transistor 300 and to resonant tunneling diode 14 through terminal 328.

In one aspect of operation, an input signal is provided to second field effect transistor 302 through input terminal 320, and first field effect transistor 300 receives a voltage from power supply 18. When the voltage of the input signal at terminal 320 equals zero volts, first field effect transistor 300 and second field effect transistor 302 produce a current at terminal 328. In one embodiment, the current produced at terminal 328 is less than peak current 102 of resonant tunneling diode 14, and resonant tunneling diode 14 remains in its low-voltage state. When the voltage of the input signal at terminal 320 increases, the current produced by field effect transistors 300 and 302 at terminal 328 increases. In one embodiment, when the voltage at terminal 320 becomes positive, the current produced at terminal 328 increases above peak current 102 of resonant tunneling diode 14, tripping resonant tunneling diode 14 into its high-voltage state. Similarly, when the voltage of the input signal at terminal 320 decreases, the current generated at terminal 328 also decreases. In one embodiment, when the voltage at terminal 320 becomes negative, the current generated at terminal 328 will not trip resonant tunneling diode 14, and resonant tunneling diode 14 remains in its low-voltage state.

Although FIG. 3 illustrates voltage-to-current converter 112 as including two field effect transistors 300 and 302, other components may be used in voltage-to-current converter 112 without departing from the scope of the present invention. For example, bipolar transistors may be used in place of field effect transistors 300 and 302.

FIG. 4 is a block diagram illustrating another exemplary voltage-to-current converter 212 constructed according to the teachings of the present invention. Voltage-to-current converter 212 may be suitable for use in analog-to-digital converter 10 of FIG. 1. In the illustrated embodiment, voltage-to-current converter 212 includes a field effect transistor 400 and a resistor 402. Field effect transistor 400 includes a source electrode 404, a gate electrode 406, and a drain electrode 408. Source electrode 404 is coupled to power supply 18 through terminal 426. Gate electrode 406 is coupled to input terminal 420. Drain electrode 408 is coupled to resistor 402. Resistor 402 is coupled to drain electrode 408 and to resonant tunneling diode 14 through terminal 428. Field effect transistor 400 receives the input signal through input terminal 420 and power from power supply 18 through terminal 426. Field effect transistor 400 and resistor 402 generate a current at terminal 428 that is proportional to the voltage of the input signal at terminal 420.

The resistance of resistor 402 may be selected to provide any desired behavior in voltage-to-current converter 212. In one embodiment, the resistance R of resistor 402 is determined by the formula: where $V_P$ represents the peak voltage 106 of resonant tunneling diode 14 and $I_p$ represents the peak current 102 of resonant tunneling diode 14. Other values for resistor 402 may be used without departing from the scope of the present invention. Also, although FIG. 4 illustrates voltage-to-current converter 212 as including a field effect transistor 400, a bipolar transistor may also be used in place of field effect transistor 400.

FIG. 5 is a block diagram illustrating an exemplary reset circuit 116 constructed according to the teachings of the present invention. Reset circuit 116 may be suitable for use in analog-to-digital converter 10 of FIG. 1. In the illustrated embodiment, reset circuit 116 includes a diode 500 and a resistor 502.

Diode 500 is coupled to resonant tunneling diode 14 at terminal 528 and to resistor 502 at a terminal 504. Diode 500 allows current to flow from terminal 528 to terminal 504 and limits the current flowing from terminal 504 to terminal 528. Diode 500 may comprise any suitable diode. In one embodiment, diode 500 comprises a Schottky diode.

Resistor 502 is coupled to diode 500 at terminal 504 and to a ground 506. Resistor 502 receives the reset signal through input terminal 524. When a reset pulse in the reset signal passes through resistor 502, current is shunted away from resonant tunneling diode 14, reducing the voltage bias across resonant tunneling diode 14 below the peak voltage 106. As a result, resonant tunneling diode 14 returns to its low-voltage state. After the reset pulse, resonant tunneling diode 14 may sample the input signal again.

FIG. 6 is a block diagram illustrating another exemplary reset circuit 216 constructed according to the teachings of the present invention. Reset circuit 216 may be suitable for use in analog-to-digital converter 10 of FIG. 1. In the illustrated embodiment, reset circuit 216 includes a diode 600, a resistor 602, and a field effect transistor 608.

Diode 600 and resistor 602 may be the same or similar to diode 500 and resistor 502, respectively, of FIG. 5. Field effect transistor 608 includes a source electrode 610, a gate electrode 612, and a drain electrode 614. Source electrode 610 is coupled to power supply 18 through terminal 630. Gate electrode 612 is coupled to input terminal 624. Drain electrode 614 is coupled to terminal 604 between diode 600 and resistor 602. Field effect transistor 608 receives the reset signal through input terminal 624 and power from power supply 18 through terminal 630. Field effect transistor 608 acts as a buffer for the reset signal, reducing the power of the reset signal that is needed to reset resonant tunneling diode 14.

Although FIG. 6 illustrates one embodiment of reset circuit 216, other embodiments may be used without departing from the scope of the present invention. For example, although FIG. 6 illustrates reset circuit 216 as including field effect transistor 608, a bipolar transistor may be used in place of field effect transistor 608.

FIG. 7 is block diagram illustrating yet another exemplary reset circuit 316 constructed according to the teachings of the present invention. Reset circuit 316 may be suitable for use in analog-to-digital converter 10 of FIG. 1. In the illustrated embodiment, reset circuit 316 includes a diode 700, a resistor 702, and a resonant tunneling diode 704.

Diode 700 may be the same or similar to diode 500 of FIG. 5. Resistor 702 is coupled to input terminal 724 and a terminal 706 between diode 700 and resonant tunneling diode 704. Resistor 702 is operable to receive the reset signal at terminal 724, producing a current at terminal 706. The current generated at terminal 706 controls the operation of resonant tunneling diode 704. Values for resistor 702 may be selected to provide any desired functionality in reset circuit 316.

Resonant tunneling diode 704 is coupled to diode 700 at terminal 706 and to a negative voltage 728 at a terminal 726. Resonant tunneling diode 704 may be the same or similar to resonant tunneling diode 14. Resonant tunneling diode 704 may, for example, operate in a low-voltage state and a high-voltage state. The state of resonant tunneling diode 704 may be controlled by the reset signal at terminal 724.

In one aspect of operation, when the reset signal received at terminal 724 has a low voltage, this generates a current at terminal 706 below the peak current of resonant tunneling diode 704. As a result, resonant tunneling diode 704 operates in a low-voltage state. The negative voltage 728 causes diode 700 to be forward-biased, and current is shunted away from resonant tunneling diode 14. This switches resonant tunneling diode 14 to its low-voltage state, resetting resonant tunneling diode 14.

When the reset signal received at terminal 724 has a high voltage, this generates a current at terminal 706 above the peak current of resonant tunneling diode 704. As a result, resonant tunneling diode 704 trips and begins operating in a high-voltage state. This reverses the bias of diode 700 and allows current to flow through resonant tunneling diode 14. Resonant tunneling diode 14 may then sample the input signal. After the sample, the reset signal at terminal 724 may again have a low voltage, which trips resonant tunneling diode 704 to its low-voltage state. Diode 700 becomes forward-biased, shunting current away from resonant tunneling diode 14 and resetting resonant tunneling diode 14 to its low-voltage state.

Using a second resonant tunneling diode 704 in reset circuit 316 may allow reset circuit 316 to operate at faster speeds than conventional reset circuits. In general, resonant tunneling diodes trip from their low-voltage state to their high-voltage state faster than they trip from their high-voltage state to their low-voltage state. One embodiment of reset circuit 316 trips resonant tunneling diode 704 from its low-voltage state to its high-voltage state when resonant tunneling diode 14 is to sample the input signal. Because resonant tunneling diode 704 trips from its low-voltage state to its high-voltage state faster, less time may elapse between the time the reset signal becomes high and the time resonant tunneling diode 14 samples the input signal. As a result, analog-to-digital converter 10 may operate at faster speeds than conventional converters.

Also, in one embodiment, analog-to-digital converter 10 does not sample the input signal until the reset signal at terminal 724 trips resonant tunneling diode 704 and allows resonant tunneling diode 14 to operate. Many conventional analog-to-digital converters use an "active reset" mechanism, where the converters remain active until a reset signal forces the converters to reset. Unlike conventional converters, one embodiment of analog-to-digital converter 10 uses an "active set" mechanism, where analog-to-digital converter 10 remains inactive until the reset signal allows analog-to-digital converter 10 to sample the input signal. The use of an active set analog-to-digital converter 10 may also increase the speed of converter 10, allowing analog-to-digital converter 10 to operate at faster speeds than conventional converters.

FIG. 8 is a block diagram illustrating still another exemplary reset circuit 416 constructed according to the teachings of the present invention. Reset circuit 416 may be suitable for use in analog-to-digital converter 10 of FIG. 1. In the illustrated embodiment, reset circuit 416 includes a diode 800, a resistor 802, a resonant tunneling diode 804, and a field effect transistor 808.

Diode 800, resistor 802, and resonant tunneling diode 804 may be the same or similar to diode 700, resistor 702, and resonant tunneling diode 704, respectively, of FIG. 7. Field effect transistor 808 includes a source electrode 810, a gate electrode 812, and a drain electrode 814. Source electrode 810 is coupled to power supply 18 through terminal 830. Gate electrode 812 is coupled to input terminal 824. Drain electrode 814 is coupled to resistor 802. Field effect transistor 808 receives the reset signal through input terminal 824 and power from power supply 18 through terminal 830. Field effect transistor 808 acts as a buffer for the reset signal, reducing the power of the reset signal that is needed to control resonant tunneling diode 804.

Although FIG. 8 illustrates one embodiment of reset circuit 416, other embodiments may be used without departing from the scope of the present invention. For example, although FIG. 8 illustrates reset circuit 416 as including field effect transistor 808, a bipolar transistor may be used in place of field effect transistor 808.

FIG. 9 is a block diagram illustrating an exemplary communication system 900 constructed according to the teachings of the present invention. In the illustrated embodiment, system 900 includes a plurality of receivers 902a–902n, a plurality of amplifiers 904a–904n, a plurality of analog-to-digital converters (ADCs) 906a–906n, and a digital averager 908. Other embodiments of system 900 may be used without departing from the scope of the present invention.

In the illustrated embodiment, each receiver 902 is coupled to an amplifier 904. Receiver 902 is operable to receive an input signal 910 and to communicate the input signal 910 to amplifier 904. Receiver 902 may receive the input signal 910 over any suitable communication medium, such as a wireless or a wireline medium. For example, receiver 902 may receive the input signal 910 over a wireless interface or a fiber optic line. Receiver 902 may comprise any hardware, software, firmware, or combination thereof operable to receive input signals 910. In one embodiment, receiver 902 comprises a receiver element in an antenna, such as a phased array antenna.

Each amplifier 904 is coupled to a receiver 902 and an analog-to-digital converter 906. Amplifier 904 is operable to receive the input signal 910 from receiver 902 and to amplify the input signal 910. Amplifier 904 is also operable to communicate the amplified signal 912 to analog-to-digital converter 906. Amplifier 904 may comprise any hardware, software, firmware, or combination thereof operable to amplify input signals 910. In one embodiment, amplifier 904 comprises a low noise amplifier operable to amplify input signals 910 without adding excessive noise to the amplified signal 912. In another embodiment, system 900 may process input signals 910 without amplifying the input signals 910.

Each analog-to-digital converter 906 is coupled to an amplifier 904 and to digital averager 908. Analog-to-digital converter 906 is operable to receive the amplified input signal 912 from amplifier 904. Analog-to-digital converter 906 is also operable to convert the input signal 912 into a digital output signal 914 that contains digital values representing the input signal. Analog-to-digital converter 906 is further operable to communicate the digital output signal 914 containing the digital values to digital averager 908. At least one analog-to-digital converter 906 may be the same or similar to analog-to-digital converter 10 of FIG. 1.

Digital averager 908 is coupled to analog-to-digital converters 906. Digital averager 908 receives the digital output signals 914 representing the input signals 910 from analog-to-digital converters 906. Digital averager 908 also averages the digital output signals 914 generated by analog-to-digital converters 906, generating an average digital output signal 916. Digital averager 908 may comprise any hardware, software, firmware, or combination thereof operable to average digital values. In one embodiment, digital averager 908 comprises a digital signal processor operable to average the digital values from analog-to-digital converters 906.

FIG. 10 is a flowchart illustrating an exemplary method 1000 for quantizing an input signal according to the teachings of the present invention. Analog-to-digital converter 10 receives an input signal at step 1002. This may include, for example, voltage-to-current converter 12 receiving the input signal at input terminal 20. Analog-to-digital converter 10 converts the voltage of the input signal to a proportional current at step 1004. This may include, for example, voltage-to-current converter 12 generating a current at terminal 28 that is proportional to the voltage at terminal 20. Analog-to-digital converter 10 provides the proportional current to a negative differential resistance element (NDRE), such as resonant tunneling diode 14, at step 1006.

Analog-to-digital converter 10 samples the input signal using the proportional current at step 1008. This may include, for example, resonant tunneling diode 14 switching from a low-voltage state to a high-voltage state if the proportional current exceeds peak current 102. This may also include resonant tunneling diode 14 remaining in the low-voltage state if the proportional current does not exceed peak current 102. The state of resonant tunneling diode 14 may be observed at output terminal 22, which allows resonant tunneling diode 14 to quantize the input signal.

Analog-to-digital converter 10 resets resonant tunneling diode 14 at step 1010. This may include, for example, reset circuit 16 shunting current away from resonant tunneling diode 14 so that the current falls below peak current 102. This may also include creating a voltage bias across resonant tunneling diode 14 below peak voltage 106. Analog-to-digital converter 10 returns to step 1002 to sample the input signal again.

FIG. 11 is a flowchart illustrating an exemplary method 1100 for resetting an analog-to-digital converter according to the teachings of the present invention. Analog-to-digital converter 10 receives a reset signal having a low voltage level at step 1102. This may include, for example, reset circuit 16 receiving the low reset signal at input terminal 24. The low voltage of the reset signal causes a second NDRE, such as resonant tunneling diode 704 in reset circuit 16, to switch to its low-voltage state at step 1104. The low-voltage state of second resonant tunneling diode 704 forward-biases diode 700 in reset circuit 16 at step 1106. The forward bias of diode 700 shunts current away from first resonant tunneling diode 14 at step 1108. The current flowing through first resonant tunneling diode 14 falls below peak current 102, and first resonant tunneling diode 14 switches to its low voltage state at step 1110. This resets first resonant tunneling diode 14 to its low-voltage state.

FIG. 12 is a flowchart illustrating an exemplary method 1200 for sampling an input signal according to the teachings of the present invention. Analog-to-digital converter 10 receives a reset signal having a high voltage level at step 1202. This may include, for example, reset circuit 16 receiving the high reset signal at input terminal 24. The high voltage of the reset signal causes a second NDRE, such as resonant tunneling diode 704 in reset circuit 16, to switch to its high-voltage state at step 1204. The high-voltage state of second resonant tunneling diode 704 reverse-biases diode 700 in reset circuit 16 at step 1206. The reverse bias of diode 700 allows current to flow through first resonant tunneling diode 14, and first resonant tunneling diode 14 may switch from its low-voltage state to its high-voltage state at step 1208. This allows first resonant tunneling diode 14 to sample the input signal.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A system for quantizing an input signal having a time-varying voltage, comprising:
    a voltage-to-current converter operable to convert the input signal to a proportional current;
    a first negative differential resistance element coupled in series with the voltage-to-current converter, the first negative differential resistance element operable to switch from a first state to a second state based on the proportional current; and
    a reset circuit coupled in parallel with the first negative differential resistance element, the reset circuit comprising a second negative differential resistance element, the reset circuit operable to reset the first negative differential resistance element to the first state based on a reset signal.

2. The system of claim 1, wherein the first and second negative differential resistance elements comprise tunneling diodes.

3. The system of claim 1, wherein the first and second negative differential resistance elements comprise resonant tunneling diodes.

4. The system of claim 1, wherein the voltage-to-current converter comprises:
    a field effect transistor operable to receive the input signal; and
    a resistor coupled in series with the field effect transistor and with the first negative differential resistance element.

5. The system of claim 1, wherein the voltage-to-current converter comprises:
    a first field effect transistor; and
    a second field effect transistor coupled in series with the first field effect transistor and with the first negative differential resistance element, the second field effect transistor operable to receive the input signal.

6. The system of claim 1, wherein the reset circuit further comprises:
    a diode coupled in parallel with the first negative differential resistance element and in series with the second negative differential resistance element; and
    a resistor coupled in series with the second negative differential resistance element and in parallel with the diode, the resistor operable to receive the reset signal.

7. The system of claim 1, wherein the reset circuit further comprises:
    a diode coupled in parallel with the first negative differential resistance element and in series with the second negative differential resistance element;
    a resistor coupled in series with the second negative differential resistance element and in parallel with the diode; and
    a field effect transistor coupled in series with the resistor, the field effect transistor operable to receive the reset signal.

8. A method for quantizing an input signal having a time-varying voltage, comprising:
    converting the input signal to a proportional current;
    providing the proportional current to a first negative differential resistance element;
    sampling the input signal based on the proportional current using the first negative differential resistance element, the first negative differential resistance element operable to switch from a first state to a second state based on the proportional current; and
    resetting the first negative differential resistance element to the first state based on a reset signal using a reset circuit, the reset circuit comprising a second negative differential resistance element coupled in parallel with the first negative differential resistance element.

9. The method of claim 8, wherein the first and second negative differential resistance elements comprise tunneling diodes.

10. The method of claim 8, wherein the first and second negative differential resistance elements comprise resonant tunneling diodes.

11. The method of claim 8, wherein the reset circuit further comprises a diode coupled in parallel with the first negative differential resistance element and in series with the second negative differential resistance element.

12. The method of claim 11, wherein sampling the input signal comprises:
   receiving a high voltage in the reset signal;
   switching the second negative differential resistance element to a third state;
   creating a reverse bias in the diode; and
   allowing at least a portion of the proportional current to flow through the first negative differential resistance element.

13. The method of claim 11, wherein resetting the first negative differential resistance element comprises:
   receiving a low voltage in the reset signal;
   switching the second negative differential resistance element to a fourth state;
   creating a forward bias in the diode; and
   shunting at least a portion of the current away from the first negative differential resistance element.

14. A system for quantizing an input signal having a time-varying voltage, comprising:
   a voltage-to-current converter comprising a current source, the voltage-to-current converter operable to convert the input signal to a proportional current;
   a first negative differential resistance element coupled in series with the voltage-to-current converter, the first negative differential resistance element operable to switch from a first state to a second state based on the proportional current; and
   a reset circuit coupled in parallel with the first negative differential resistance element, the reset circuit comprising a second negative differential resistance element, the reset circuit operable to reset the first negative differential resistance element to the first state based on a reset signal.

15. The system of claim 14, wherein the first and second negative differential resistance elements comprise tunneling diodes.

16. The system of claim 14, wherein the first and second negative differential resistance elements comprise resonant tunneling diodes.

17. The system of claim 14, wherein the reset circuit further comprises:
   a diode coupled in series with the second negative differential resistance element; and
   a resistor coupled in parallel with the diode and in series with the second negative differential resistance element, the resistor operable to receive the reset signal.

18. The system of claim 14, wherein the reset circuit further comprises:
   a diode coupled in series with the second negative differential resistance element;
   a resistor coupled in parallel with the diode and in series with the second negative differential resistance element; and
   a field effect transistor coupled in series with the resistor, the field effect transistor operable to receive the reset signal.

* * * * *

UNITED STATES PATENT AND TRADEMARK OFFICE
CERTIFICATE OF CORRECTION

PATENT NO. : 6,456,215 B1
DATED : September 24, 2002
INVENTOR(S) : Gary A. Frazier It is certified that error appears in the above-identified patent and that said Letters Patent is hereby corrected as shown below:

Column 7,
Line 43, after "formula:" insert -- $R=V_P/I_P$ --.

Column 9,
Line 54, after "receives", delete "the-reset", and insert -- the reset --.

Signed and Sealed this

Eighteenth Day of March, 2003

JAMES E. ROGAN
*Director of the United States Patent and Trademark Office*